(12) United States Patent
Bonart

(10) Patent No.: US 9,799,579 B2
(45) Date of Patent: Oct. 24, 2017

(54) SEMICONDUCTOR SUBSTRATE-ON-SEMICONDUCTOR SUBSTRATE PACKAGE AND METHOD OF MANUFACTURING THE SAME

(71) Applicant: Infineon Technologies AG, Neubiberg (DE)

(72) Inventor: Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/367,972

(22) Filed: Dec. 2, 2016

(65) Prior Publication Data

US 2017/0162460 A1    Jun. 8, 2017

(30) Foreign Application Priority Data

Dec. 3, 2015    (DE) .......... 10 2015 121 066

(51) Int. Cl.

| | |
|---|---|
| *H01L 23/58* | (2006.01) |
| *H01L 21/66* | (2006.01) |
| *H01L 25/16* | (2006.01) |
| *H01L 27/15* | (2006.01) |
| *F21Y 115/10* | (2016.01) |
| *B60Q 1/04* | (2006.01) |
| *B60Q 1/30* | (2006.01) |
| *F21S 8/10* | (2006.01) |

(52) U.S. Cl.
CPC ............ *H01L 22/32* (2013.01); *H01L 22/14* (2013.01); *H01L 25/167* (2013.01); *H01L 27/156* (2013.01); *B60Q 1/04* (2013.01); *B60Q 1/30* (2013.01); *F21S 48/115* (2013.01); *F21S 48/215* (2013.01); *F21Y 2115/10* (2016.08)

(58) Field of Classification Search
CPC ....... H01L 22/32; H01L 22/14; H01L 25/167; H01L 27/156
USPC .......................................... 257/48
See application file for complete search history.

(56) References Cited

U.S. PATENT DOCUMENTS

| | | | |
|---|---|---|---|
| 5,621,225 A | 4/1997 | Shieh et al. | |
| 6,879,169 B2 * | 4/2005 | Ohtaki | G01R 31/2863 324/750.05 |

(Continued)

FOREIGN PATENT DOCUMENTS

DE    69634813 T2    11/2005

*Primary Examiner* — Trung Q Dang

(57) ABSTRACT

A semiconductor assembly includes a first semiconductor substrate having a first main surface and a second main surface and a second semiconductor substrate having a first main surface and a second main surface. The first main surface of the first semiconductor substrate faces the second main surface of the second semiconductor substrate. Further, the semiconductor assembly includes a plurality of first electrodes disposed on the first main surface of the first semiconductor chip and a plurality of second electrodes disposed on the second main surface of the second semiconductor chip, wherein the first electrodes are aligned with and connected by interconnects to the second electrodes. An electrically conducting layer perforated by holes is disposed between and fixed to the first semiconductor substrate and the second semiconductor substrate, wherein the interconnects penetrate the holes. The electrically conducting layer is electrically connected to a function test electrode of the semiconductor assembly.

22 Claims, 4 Drawing Sheets

(56) References Cited

U.S. PATENT DOCUMENTS

| | | | |
|---|---|---|---|
| 7,671,609 B2* | 3/2010 | Sato | A63H 29/22 324/755.09 |
| 2001/0005043 A1* | 6/2001 | Nakanishi | H01L 21/6835 257/678 |
| 2006/0084297 A1* | 4/2006 | Inoue | H01L 23/49827 439/91 |
| 2007/0232023 A1 | 10/2007 | Tong et al. | |
| 2015/0037914 A1* | 2/2015 | Takahashi | H01L 22/14 438/15 |
| 2015/0102447 A1 | 4/2015 | Huet et al. | |

\* cited by examiner

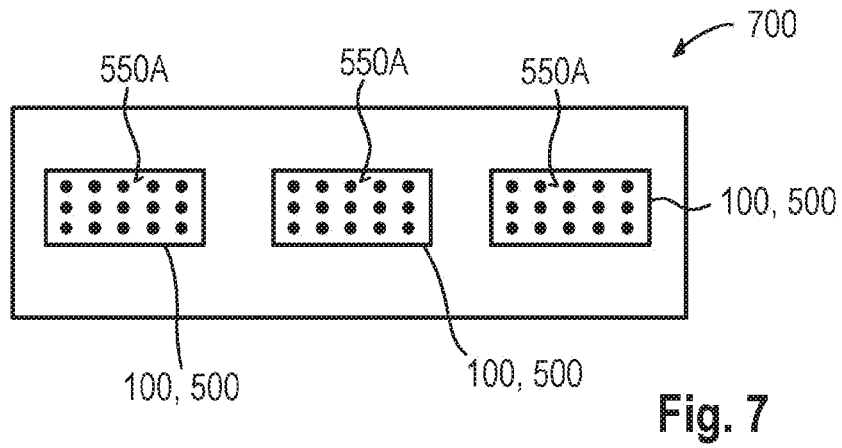

Fig. 7

Arranging an electrically conducting layer perforated by holes between a first semiconductor substrate and a second semiconductor substrate, wherein the holes are aligned with first electrodes of the first semiconductor substrate and second electrodes of the second semiconductor substrate

↓

Electrically interconnecting the first electrodes to the second electrodes by interconnects penetrating the holes

Fig. 8A

Testing the semiconductor assembly by applying a test voltage to a test electrode of the semiconductor assembly, wherein the test electrode is electrically connected with the electrically conducting layer

Fig. 8B

SEMICONDUCTOR SUBSTRATE-ON-SEMICONDUCTOR SUBSTRATE PACKAGE AND METHOD OF MANUFACTURING THE SAME

TECHNICAL FIELD

This invention relates to the technique of semiconductor substrate packaging, and in particular to the technique of manufacturing and testing semiconductor assemblies comprising semiconductor chips or semiconductor wafers which are stacked together.

BACKGROUND

Semiconductor substrate manufacturers are constantly striving to increase the performance of their products, while decreasing their cost of manufacture. An important area in the manufacture of semiconductor substrates is testing the semiconductor substrates. As those skilled in the art are aware, package-level testing involves depositing the manufactured devices into testing sockets to screen failed packages from good ones. Testing may be time consuming and could be unreliable to some extent depending on the kind of test method applied.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 schematically illustrates a device such as, e.g., a light source comprising a group of a plurality of semiconductor assemblies.

FIG. 8A is a flowchart of an exemplary process of manufacturing a semiconductor assembly.

FIG. 8B is a flowchart of an exemplary process of testing a semiconductor assembly.

DETAILED DESCRIPTION

Figure 1:
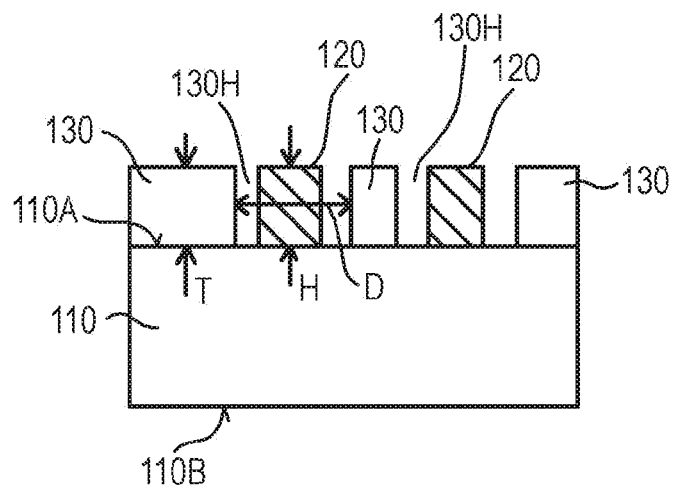
FIG. 1 schematically illustrates a cross-sectional view of an exemplary first semiconductor substrate of an exemplary semiconductor assembly.

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the words "over" or "above" used with regard to a part, element or material layer formed or located "over" or "above" a surface may be used herein to mean that the part, element or material layer be located (e.g. placed, formed, deposited, etc.) "directly on", e.g. in direct contact with, the implied surface. The words "over" or "above" used with regard to a part, element or material layer formed or located "over" or "above" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms or "under", "below", "beneath", etc.

The semiconductor assemblies described herein contain at least two semiconductor substrates. These semiconductor substrates may be of different types and may be manufactured by different technologies. They may include (monolithic) integrated circuits, for example logic integrated circuits, analogue integrated circuits, mixed signal integrated circuits, memory circuits, microcontrollers, optoelectronic circuits, in particular optical emitters and/or sensors.

Each of the semiconductor substrates referred to herein may be manufactured based on a specific semiconductor material such as, for example, Si, SiC, SiGe, GaAs, GaN, AlGaN, InGaAs, InAlAs, etc. In this connection, a first semiconductor substrate and a second semiconductor substrate may be of identical semiconductor material or may be of different semiconductor materials. In the latter case, the first semiconductor substrate and the second semiconductor substrate may have different CTE (coefficient of thermal expansion) values, i.e. are subjected to a CTE mismatch.

A first semiconductor substrate referred to herein may, e.g., comprise an array (or matrix) of drivers, e.g. optoelectronic emitter drivers such as, e.g. LED (light emitting diode) drivers. A second semiconductor substrate referred to herein may, e.g., comprise a plurality of optoelectronic devices, in particular an array (or matrix) of LEDs.

The semiconductor substrates referred to herein may comprise or be semiconductor chips. It is also possible that the semiconductor substrates referred to herein may comprise or be semiconductor wafers.

The first semiconductor substrate and the second semiconductor substrate are typically mounted face-to-face and are electrically interconnected by a large number of electrical interconnects. In other words, an interface between the first semiconductor substrate and the second semiconductor substrate may include a high number and/or high areal density of electrically interconnecting substrate-to-substrate contacts. The number of electrical interconnects may be equal to or greater than 500, 1,000, 5,000, 10,000, 50,000, 100,000, 500,000, or 1,000,000 per semiconductor assembly and may correspond to the number of electrodes at each semiconductor substrate. The areal density of electrically interconnects contacts (or electrodes at each semiconductor substrate) may be equal to or greater than 20 $mm^{-2}$, 40 $mm^{-2}$, 200 $mm^{-2}$, 400 $mm^{-2}$, 2,000 $mm^{-2}$, 4,000 $mm^{-2}$, 20,000 $mm^{-2}$, or 40,000 $mm^{-2}$. By way of example, the lateral distance P (pitch) between center points of adjacent first electrodes 120 may be equal to or greater than or less than 5 µm, 15 µm, 30 µm, 50 µm, 70 µm, 90 µm, 110 µm, 130 µm, or 150 µm.

Further, the interface between the first semiconductor substrate and the second semiconductor substrate may include an electrically conducting layer having holes through which the electrical interconnects (which may comprise or be formed by aligned electrodes of semiconductor substrates) protrude. Thus, the number and/or the areal density of the holes in the electrically conducting layer may be equal to the above quantities, respectively.

In accordance with the description herein, the electrically conducting layer may be used in functional tests as a "floating" test electrode. This allows easy and rapid testing of the semiconductor assembly while improving the reliability of the semiconductor assembly during normal operation.

Figure 4A:
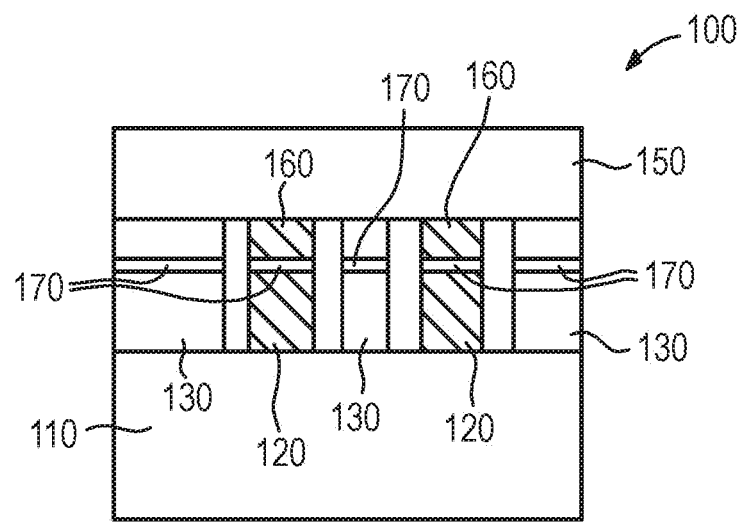
FIG. 4A schematically illustrates a cross-sectional view of an exemplary semiconductor assembly produced by connecting the first semiconductor substrate of FIGS. 1 and 2 to the second semiconductor substrate of FIG. 3.

FIG. 1 illustrates a first semiconductor substrate 110 of an exemplary semiconductor assembly 100 (see FIG. 4A). The first semiconductor substrate 110 comprises a first main surface 110A and a second main surface 110B opposite the first main surface 110A. The first semiconductor substrate 110 may be of any semiconductor material as mentioned herein. In particular, the first semiconductor substrate 110 may be based on Si. Further, the first semiconductor substrate 110 may implement any integrated circuit (IC) as mentioned herein. In particular, the first semiconductor substrate 110 may implement a driver circuitry for driving a plurality of optoelectronic devices, e.g., LEDs. In other examples the first semiconductor substrate 110 may implement an IC configured as a microcontroller.

A plurality of first electrodes 120 is arranged on the first main surface 110A of the first semiconductor substrate 110. The plurality of first electrodes 120 may be electrically connected to the IC of the first semiconductor substrate 110, e.g. to a plurality of optoelectronic device drivers (not shown). Further, an electrically conducting layer 130 perforated by holes 130H is disposed over the first main surface 110A of the first semiconductor substrate 110.

The first electrodes 120 and the holes 130H of the electrically conducting layer 130 are (vertically and/or axially) aligned. Each hole 130H may expose a portion of the first main surface 110A within which one first electrode 120 is arranged. The first electrodes 120 may project into or penetrate through the holes 130H. More specifically, each or at least a part of the holes 130H may be equipped with one first electrode 120 which projects into or penetrates through the hole 130H. As such, the electrically conducting layer 130 may extend between neighboring first electrodes 120, in particular between each two neighboring first electrodes 120.

The first electrodes 120 are electrically disconnected from the electrically conducting layer 130. As such, the first electrodes 120 are laterally spaced apart from the inner walls of the holes 130H by at least a certain gap distance G. The gap distance G guarantees the electrical insulation between the first electrodes 120 and the electrically conducting layer 130. In other words, the gap distance G prevents the first electrodes 120 from being shortened by the electrically conducting layer 130.

By way of example, the lateral gap distance G between an outer wall of a first electrode 120 and an inner wall of one of the holes 130H in the electrically conducting layer 130 may be equal to or greater than or less than 2 µm, 5 µm, 10 µm, 20 µm, 30 µm, 40 µm, or 50 µm.

By way of example, the electrically conducting layer 130 may have a thickness T of equal to or greater than or less than 0.1 µm, 0.5 µm, 1 µm, 2 µm, 3 µm, 4 µm, or 5 µm.

The first electrodes 120 may have a height H over the first main surface 110A of the first semiconductor substrate 110. In particular, the height H may be equal to the thickness T of the electrically conducting layer 130. However, it is also possible that H is smaller or greater than T.

By way of example, the holes 130H in the electrically conducting layer 130 may have a diameter D equal to or greater than or less than 1 µm, 5 µm, 10 µm, 50 µm, 100 µm, or 150 µm.

Figure 3:
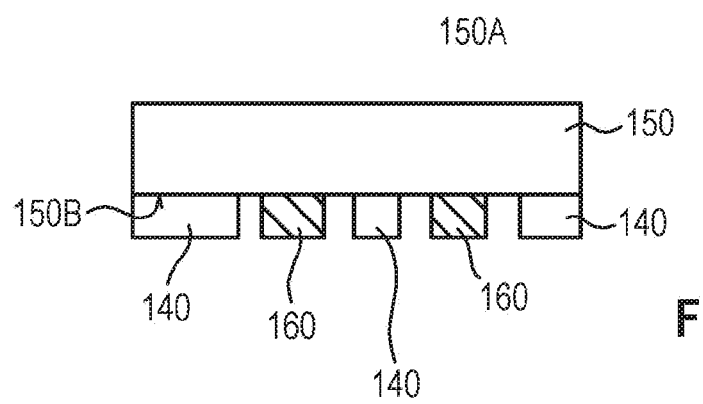
FIG. 3 schematically illustrates a cross-sectional view of an exemplary second semiconductor substrate of an exemplary semiconductor assembly.

FIG. 3 illustrates a second semiconductor substrate 150 of an exemplary semiconductor assembly 100 (see FIG. 4A). The second semiconductor substrate 150 comprises a first main surface 150A and a second main surface 150B opposite the first main surface 150A. The second semiconductor substrate 150 may be of any semiconductor material as mentioned herein. In particular, the second semiconductor substrate 150 may be based on a compound semiconductor or on Si. Further, the second semiconductor substrate 150 may implement any IC as mentioned herein. In particular, the second semiconductor substrate 150 may implement a plurality of optoelectronic devices, e.g., LEDs. In particular in this case, the second semiconductor substrate 150 may, e.g., be based on a compound semiconductor such as, e.g., SiC, SiGe, GaAs, GaN, AlGaN, InGaAs, or InAlAs. In other examples the second semiconductor substrate 150 may implement an IC configured as, e.g., a microcontroller. In this case, the second semiconductor substrate 150 may, e.g., be based on Si.

A plurality of second electrodes 160 is arranged on the second main surface 150B of the second semiconductor substrate 150. The plurality of second electrodes 160 may be electrically connected to an IC of the second semiconductor substrate 150, e.g. to a plurality of optoelectronic devices such as, e.g., LEDs (not shown). Further, an electrically conducting layer 140 may optionally be disposed over the second main surface 150B of the second semiconductor substrate 150. If present, the electrically conducting layer 140 may be perforated by holes 140H and each hole 140H may expose a portion of the second main surface 150B within which one second electrode 160 is arranged.

Figure 2:
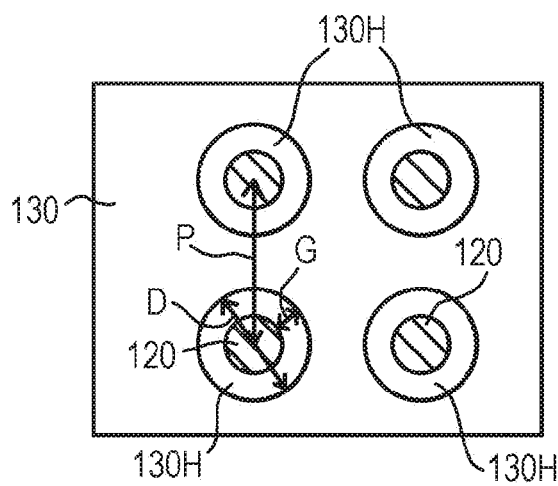
FIG. 2 schematically illustrates a top view of the exemplary first semiconductor substrate of FIG. 1.

While the structure of the electrically conducting layer 140, the holes 140H perforating the electrically conducting layer 140 and the second electrodes 160 may be similar to the structure of the electrically conducting layer 130, the holes 130H and the first electrodes 120 arranged on the first semiconductor substrate 110, and therefore, all disclosure above related to FIGS. 1 and 2 and in particular the dimensional and structural properties of the electrically conducting layer 130, the holes 130H and the first electrodes 120 may equally apply to FIG. 3, it is also possible that the second semiconductor substrate 150 is not equipped with an electrically conducting layer 140 and/or that the second electrodes 160 do not project over the second main surface 150B of the second semiconductor substrate 150.

FIG. 4A illustrates the semiconductor assembly 100 comprising the first semiconductor substrate 110 and the second semiconductor substrate 150 connected to each other in a face-to-face relationship, i.e. with the first electrodes 120 and the second electrodes 160 connected to each other by bonds 170. The bonds 170 may be selected from the group comprising of a diffusion solder bond, a soft solder bond, a hard solder bond, a sintered metal bond and an electrically conducting adhesive bond. Each bond 170 guarantees that one first electrode 120 and one second electrode 160 are mechanically fixed together and electrically interconnected to each other.

Bonds 170 may further be arranged between the electrically conducting layer 130 and the electrically conducting layer 140 or, if no electrically conducting layer 140 is provided, between the second main surface 150B of the second semiconductor substrate 150. Here, the bond material ensures that a major part of the second main surface 150B of the second semiconductor substrate 150 is mechanically fixed to the electrically conducting layer 130. By way of example, the electrically conducting layer 130 may cover an area equal to or greater than 60%, 70%, 80%, or 90% of the total area of the first main surface 110A of the first semiconductor substrate 110 or of the second main surface 150B of the second semiconductor substrate 150. In other words, the electrically conducting layer(s) 130 (and 140) and bond 170 guarantees that a substantial area of the lateral size of the first and second semiconductor substrates 110 and 150 are fixedly interconnected to each other. This prevents stress-induced cracking of the electrical interconnects 120, 160 between the first and second semiconductor substrates 110 and 150 and thus greatly enhances the production yield and operational reliability of the semiconductor assembly 100.

In other words, the electrically conducting layer 130 (and, if present, electrically conducting layer 140) allows to protect the electrical interconnect (i.e. the connections of the first electrodes 120 to the second electrodes 160) from mechanical failure such as rupture or disconnection. This risk of mechanical failure may be caused by different CTEs of the materials involved, i.e. of the first semiconductor substrate 110, the second semiconductor substrate 150 and the material of the electrically conducting layer(s) 130 (140) and the first and/or second electrodes 120, 160. In summary, the greater the percentage of coverage of the total area of the first main surface 110A or the second main surface 150B by the electrically conducting layer(s) 130 (140), the more stable and stress-resistant is the electrical/mechanical interface between the first semiconductor substrate 110 and the second semiconductor substrate 150.

The electrically conducting layer 130 may, e.g., comprise or be of any suitable metal material such as, e.g., copper, aluminum, etc. The bond 170 may, e.g., be of AuSn, AgSn, CuSn, AgIn, AuIn, AuGe, CuIn, AuSi, Sn, Au or other materials which are used to bond electrodes or semiconductor chips together. It is to be noted that generally, the bond 170 between the first and second electrodes 120 and 160 and the bond 170 between the electrically conducting layer(s) 130, (140) may be of the same material or may be of different materials.

Further, the first electrodes 120 may be made of the same material than the electrically conducting layer(s) 130, (140) or the first electrodes 120 may be made of a different material than the electrically conducting layer(s) 130, (140). By way of example, the electrically conducting layer 130 and/or the first electrodes 120 may be manufactured by a plating process, e.g. by galvanic plating or by electroless plating. If a galvanic plating process is used, a seed layer (not shown) may be deposited onto the first main surface 110A of the first semiconductor substrate 110, and the seed layer (not shown) may then be employed as an electrode to plate copper or other metal or metal alloys onto the seed layer to the desired height, e.g. T and H, respectively. Electroless plating, which is also referred to as chemical plating in the art, may alternatively be used, and further, other deposition methods such as, e.g., physical vapor deposition (PVD), chemical vapor deposition (CVD), sputtering, printing, etc. may also be employed.

It might also be possible that the electrically conducting layer 130 comprising the array (or matrix) of holes 130H may be prefabricated as a perforated plate and then applied to the first main surface 110A of the first semiconductor substrate 110.

The electrically conducting layer 140 with holes 140H, if present, and the second electrodes 160 may be fabricated in the same way as described above in conjunction with the electrically conducting layer 130 with holes 130H and the first electrodes 120, and reference is made to the above description in order to avoid reiteration.

Further to FIG. 4A, the distance between the first main surface 110A of the first semiconductor substrate 110 and the second main surface 150B of the second semiconductor substrate 150 may be equal to or greater than or less than 0.1 µm, 0.5 µm, 1 µm, 2 µm, 3 µm, 4 µm, or 5 µm. In other words, the electrically conducting layer 130 (and, if present, the electrically conducting layer 140) may have a thickness which may define the distance between the first semiconductor substrate 110 and the second semiconductor substrate 150.

Figure 4B:
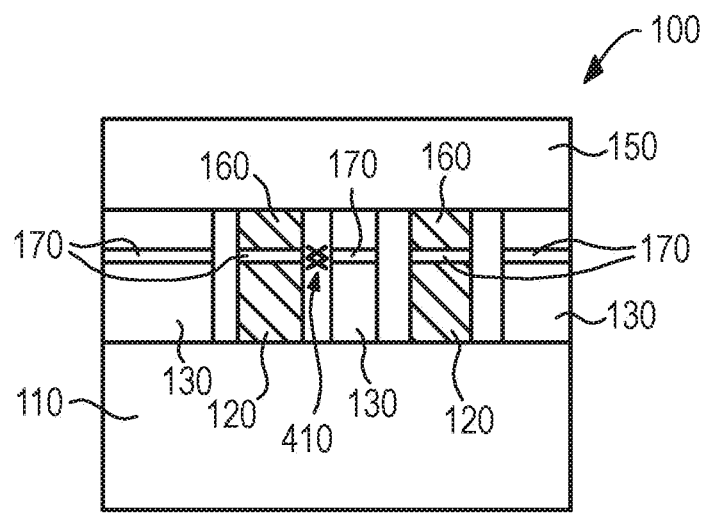
FIG. 4B schematically illustrates a cross-sectional view of the exemplary semiconductor assembly of FIG. 4A with an electrical failure occurring at the interface between the first semiconductor substrate and the second semiconductor substrate FIG. 5 schematically illustrates a cross-sectional view of an exemplary semiconductor assembly.

FIG. 4B illustrates critical failure modes. By way of example, a critical failure could arise by shorts 410 due to bond material bleed-outs or solder-creeps. Such bond material bleed-outs or solder-creeps could be relevant for increasing the failure probability over product lifetime. They could create weak isolation (lifetime relevant) or could shorten (production yield relevant) one or more of the first and second electrodes 120, 160 to the electrically conducting layer(s) 130 (140). Other critical failure modes resulting in similar problems could arise due to alignment errors of the first electrodes 120 to the second electrodes 160 or by bond material misconnections between corresponding first and second electrodes 120 and 160.

Figure 5:
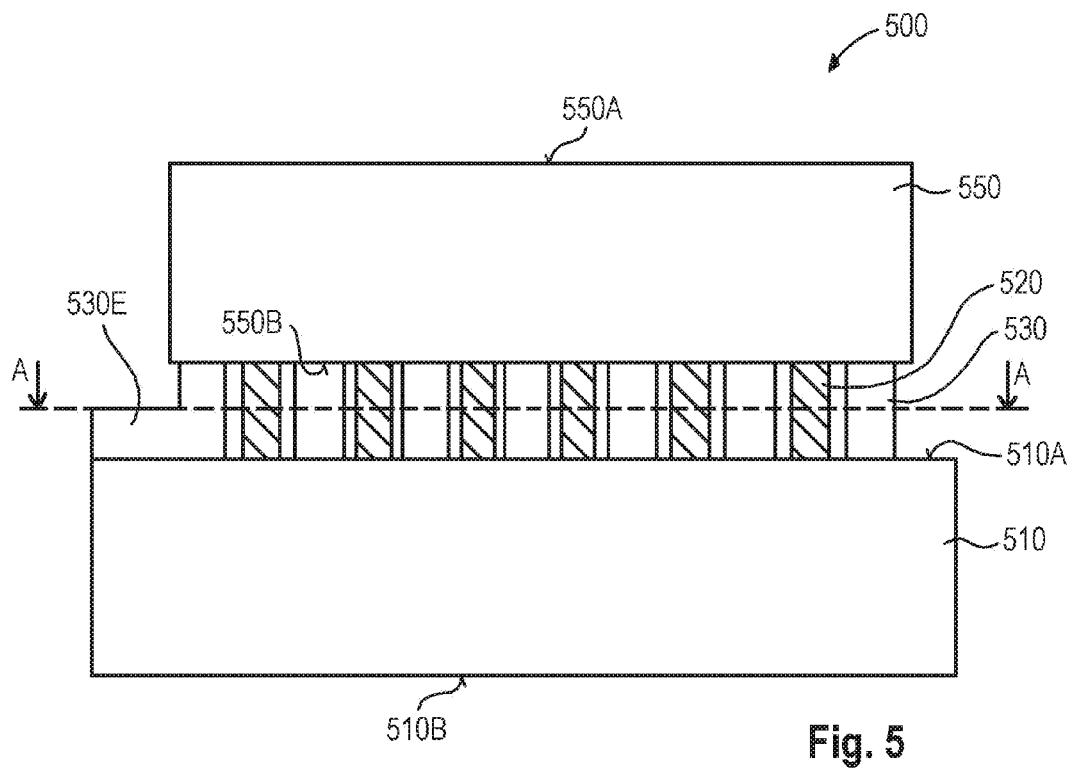

FIG. 5 schematically illustrates a cross-sectional view of an exemplary semiconductor assembly 500. The semiconductor assembly 500 may be similar to the semiconductor assembly 100 and vice versa. Briefly, first semiconductor substrate 510 and main surfaces 510A, 510B thereof correspond to first semiconductor substrate 110 and main surfaces 110A, 110B thereof, second semiconductor substrate 550 and main surfaces 550A, 550B thereof correspond to second semiconductor substrate 150 and main surfaces 150A, 150B thereof, electrically conducting layer 530 corresponds to electrically conducting layer 130 (optionally complemented by electrically conducting layer 140 and bonds 170) and interconnects 520 correspond to first electrodes 120 (optionally complemented by second electrodes 160 and bonds 170). As such, the electrically conducting layer 530 may extend between neighboring interconnects 520, in particular between each two neighboring interconnects 520. Thus, reference is made to the above description of these parts in order to avoid reiteration. Further, all disclosure presented in relation with semiconductor assembly 500 could equally apply to semiconductor assembly 100.

FIG. 5 illustrates a function test electrode 530E. The function test electrode 530 is electrically connected to the electrically conducting layer 530. By way of example, the function test electrode 530E may form an integral part of the electrically conducting layer 530. In other examples the function test electrode 530E may be connected to the electrically conducting layer 530 by a conducting trace, a bond wire, etc.

Figure 6:
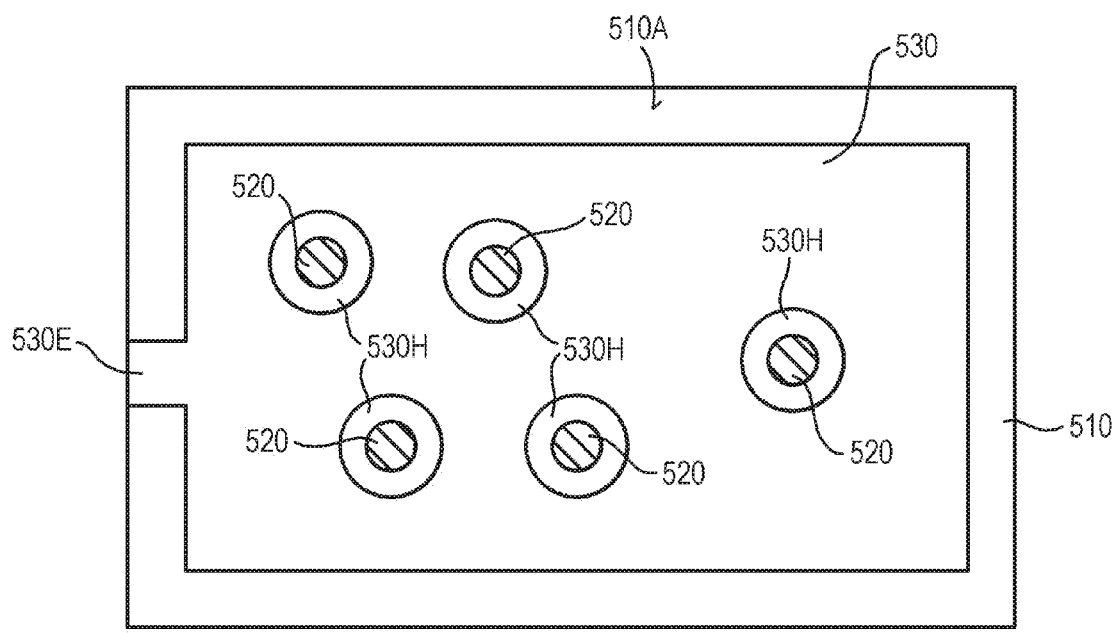
FIG. 6 schematically illustrates a cross-sectional view along line A-A of the exemplary semiconductor assembly of FIG. 5.

The function test electrode 530E may be exposed at the periphery of the semiconductor assembly 500. The function test electrode 530E may thus be accessible by external test equipment. By way of example, the function test electrode 530E may be arranged at a region of the first semiconductor substrate 510 which is not covered by the second semiconductor substrate 550. More specifically, as exemplified in FIG. 6, the function test electrode 530E may be located in peripheral region of a first main surface 510A (corresponding to the first main surface 110A) of the first semiconductor substrate 510 adjacent to a side wall or edge thereof. FIG. 6 further illustrates that the electrically conducting layer 530 may completely cover the first main surface 510A of the first semiconductor substrate 510 except the holes 530H and a frame-like edge portion of the first main surface 510A. Without saying, the illustrations of FIGS. 5 and 6 are not to scale, i.e. only a few enlarged holes are depicted for the sake of illustrative ease.

That way, the function test electrode 530E may easily be contacted by a pin contact of an external test equipment such as, e.g., a socket in which the semiconductor assembly 500 is placed during a function test. Such function test may be performed after assembly of the semiconductor assembly 100, 500 in an efficient short test. The testing time may be very short compared to so-called Burn-In lifetime tests. In addition, the product safety will be increased and the product (being or including the semiconductor assembly 100, 500) is increased and the product will be robust against single contact failure or shorts.

It is to be noted that neither the function test electrode 530E nor the electrically conducting layer 530 may be connected to an internal wiring or the integrated circuit (IC) of the first semiconductor substrate 510 and/or to the integrated circuit (IC) of the second semiconductor substrate 550. In particular, the function test electrode 530E connected to the electrically conducting layer 530 may be electrically disconnected to ground (GND) and/or a supply voltage such as, e.g., VCC, VDD, etc., of either the first and/or the second semiconductor substrates 510, 550. This allows the electrically conducting layer 530 (and the function test electrode 530E connected thereto) to be on a floating potential in a non-test mode, i.e. if the function test electrode 530E is not connected to an external circuitry. In particular, the electrically conducting layer 530 and the function test electrode 530E may be left on a floating potential during normal operation of the semiconductor assembly 500.

That is, the electrically conducting layer 530 may be electrically disconnected or isolated from any power supply electrode (such as, e.g., ground (GND) or VCC, VDD) of the first semiconductor substrate 510 and/or the second semiconductor substrate 550. Further, the electrically conducting layer 530 and the test function electrode 530E may be electrically disconnected or isolated from any internal wiring or IC of the first semiconductor substrate 510 and/or the second semiconductor substrate 550.

During testing of the semiconductor assembly 100, 500, the function test electrode 530E may be connected to a test voltage provided by a test equipment (not shown). The test voltage may be equal to or greater than 5, 7 or 10 times the operational voltage of the first semiconductor substrate 510 or the second semiconductor substrate 550. By way of example, the operation voltage of the second semiconductor substrate 550 may be about 3-5 V (which is a typical operation voltage for a LED semiconductor chip). The test voltage applied to the function test electrode 530E and, e.g., a (e.g. common) ground electrode (GND) of the first semiconductor substrate 510 and/or the second semiconductor substrate 550 may be considerably higher, e.g. about 50-60 V. For example, the negative potential of the test voltage may be applied to the function test electrode 530E and the positive potential of the test voltage may be applied to the common ground (GND) contact of the semiconductor assembly 500.

During testing a weak or broken insulation between the electrically conducting layer 530 and the interconnect (e.g. the interconnected chip electrodes 120, 160) of the first semiconductor substrate 510 and the second semiconductor substrate 550 may be detected. If electrical breakdown occurs, one of the first or second semiconductor substrates 510, 550 will burn through, i.e. will typically be destroyed.

After the semiconductor assembly 100, 500 has passed the functional test, during normal operation, however, the function test electrode 530E may not be electrically contacted by external circuitry, e.g. by an application board (not shown) on which the semiconductor assembly 100, 500 is mounted. That is, the electrically conducting layer 530 may be left floating during normal operation. Stated differently the function test electrode 530E may only used during the function test mode and may have no bearing or function during normal operation. In this case, a single short between any electrodes 120, 160 of the first and/or second semiconductor substrate 100, 110 or 510, 550 and the surrounding electrically conducting layer 130 or 530 will not result in a failure of the semiconductor assembly 100 or 500. Thus, the reliability of the semiconductor assembly 100, 500 in normal operation is improved if compared to any alternative implementations in which the electrically conducting layer 130, 530 is electrically connected to one of the first or second semiconductor substrates 110, 130 or 510, 550 rather than left floating as proposed herein.

FIG. 7 schematically illustrates a top view on the first main surfaces 150A, 550A of second semiconductor substrates 150, 550 of a group of a plurality of semiconductor assemblies 100, 500. In the example shown, the group comprises of, e.g., three semiconductor assemblies 100, 500. The group of semiconductor assemblies 100, 500 may form, e.g., a light source 700 such as, e.g., a motor vehicle front lamp, a motor vehicle rear lamp, etc. The light source may emit, e.g., white light. It is to be noted that power applications are possible, i.e. that the second semiconductor substrate 150, 550 emits a light power of equal to or more than 2, 4, 6, or 8 W per mm$^2$ of the second semiconductor substrate 150, 550. Each LED of the second semiconductor substrate 150, 550 may form a pixel of a LED matrix and each LED may be contacted to an individual LED driver of a LED driver matrix formed in the first semiconductor substrate 110, 510.

In other applications the first semiconductor substrate 110, 510 and the second semiconductor substrate 150, 550 are microcontrollers interconnected by the plurality of interconnects 520. Also in this case, high power densities such as mentioned above could be reached.

FIG. 8A is a flow chart of an exemplary process of manufacturing a semiconductor assembly 100, 500.

At S1, an electrically conducting layer perforated by holes is arranged between a first semiconductor substrate and a second semiconductor substrate. The holes are aligned with first electrodes of the first semiconductor substrate and second electrodes of the second semiconductor substrate. As mentioned previously, the electrically conducting layer and the holes may be formed by various methods, such as galvanically or electroless plating, soldering, sintering, gluing using a conducting adhesive, etc.

At S2, the first electrodes are electrically interconnected to the second electrodes by forming interconnects penetrating the holes. As mentioned previously, these interconnects may be formed by various methods, such as galvanically or electroless plating, soldering, sintering, gluing using a conducting adhesive, etc.

By way of example, after having produced the electrically conducting layer 130 with holes 130H and the first electrodes 120, soldering may be performed as follow: First, solder deposits may be attached to the electrically conducting layer 130 and the first electrodes 120 and/or to the counterpart electrically conducting layer 140 and the second electrodes 160. Then, the first and second semiconductor substrates 110, 150 or 510, 550 are positioned in alignment to each other and put together. The first and second semiconductor substrates 110, 150 or 510, 550 may then be transferred to a furnace in which heat is applied to effect soldering. Note that these processes could be performed on chip level (if the substrates are chips) or on wafer level (if the substrates are still wafers). In the latter case, a wafer-to-wafer semiconductor assembly may be singulated into chip-to-chip semiconductor assemblies by cutting, dicing, etc.

FIG. 8B is a flow chart of an exemplary process of testing a semiconductor assembly 100, 500.

At S3, a test voltage is applied to a test electrode of the semiconductor assembly, wherein the test electrode is electrically connected with the electrically conducting layer. The test voltage may be equal to or greater than 5, 7 or 10 times the operational voltage of the first semiconductor substrate and/or the second semiconductor substrate. After testing, e.g. during normal operation of the semiconductor assembly, the test electrode may be left floating.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, instead of a contact clip it is also possible to use a contact ribbon. This application is intended to cover any adaptations or variations of the specific embodiments discussed herein.

What is claimed is:

1. A semiconductor assembly, comprising:
    a first semiconductor substrate having a first main surface and a second main surface;
    a second semiconductor substrate having a first main surface and a second main surface, wherein the first main surface of the first semiconductor substrate faces the second main surface of the second semiconductor substrate;
    a plurality of first electrodes disposed on the first main surface of the first semiconductor chip;
    a plurality of second electrodes disposed on the second main surface of the second semiconductor chip, wherein the first electrodes are aligned with and electrically connected to the second electrodes;
    an electrically conducting layer perforated by holes, wherein the layer is disposed between the first semiconductor substrate and the second semiconductor substrate, wherein the first electrodes and the second electrodes are interconnected to each other through the holes; and
    a function test electrode electrically connected to the electrically conducting layer.

2. The semiconductor assembly of claim 1, wherein the first semiconductor substrate is a first semiconductor chip and the second semiconductor substrate is a second semiconductor chip.

3. The semiconductor assembly of claim 1, wherein the first semiconductor substrate is a first semiconductor wafer and the second semiconductor substrate is a second semiconductor wafer.

4. The semiconductor assembly of claim 1, wherein the first semiconductor substrate comprises an optoelectronic device, in particular an array of LEDs.

5. The semiconductor assembly of claim 1, wherein the second semiconductor substrate comprises a driver circuitry, in particular an array of LED drivers.

6. The semiconductor assembly of claim 1, wherein the first semiconductor substrate is based on silicon.

7. The semiconductor assembly of claim 1, wherein the second semiconductor substrate is based on a compound semiconductor.

8. The semiconductor assembly of claim 1, wherein the electrically conducting layer has a thickness of equal to or greater than 0.1 μm, 0.5 μm, 1 μm, 2 μm, 3 μm, 4 μm, or 5 μm.

9. The semiconductor assembly of claim 1, wherein the holes have a diameter equal to or greater than 1 μm, 5 μm, 10 μm, 50 μm, 100 μm, or 150 μm.

10. The semiconductor assembly of claim 1, wherein a lateral distance between an outer wall of a first and/or second electrode and an inner wall of one of the holes is equal to or greater than 2 μm, 5 μm, 10 μm, 20 μm, 30 μm, 40 μm, or 50 μm.

11. The semiconductor assembly of claim 1, wherein the electrically conducting layer covers an area equal to or greater than 60%, 70%, 80%, or 90% of the total area of the first main surface of the first semiconductor substrate or of the second main surface of the second semiconductor substrate.

12. The semiconductor assembly of claim 1, further comprising:
    a plurality of bonds arranged between the first and second electrodes, wherein each bond is selected from the group consisting of a diffusion solder bond, a soft solder bond, a hard solder bond, a sintered metal bond and an electrically conducting adhesive bond.

13. The semiconductor assembly of claim 1, wherein the function test electrode is exposed at a periphery of the semiconductor assembly.

14. The semiconductor assembly of claim 1, wherein the electrically conducting layer is electrically disconnected from any power supply electrode of the first semiconductor substrate.

15. The semiconductor assembly of claim 1, wherein the electrically conducting layer is electrically disconnected from any internal wiring or integrated circuit of the first semiconductor substrate.

16. A light source, wherein the light source comprising one or more semiconductor assemblies of claim 1.

17. The light source of claim 16, wherein the light source is a motor-vehicle front lamp or a motor-vehicle rear lamp.

18. A method of manufacturing and testing a semiconductor assembly, comprising:
arranging an electrically conducting layer perforated by holes between a first semiconductor substrate and a second semiconductor substrate, wherein the holes are aligned with first electrodes of the first semiconductor substrate and second electrodes of the second semiconductor substrate;
electrically interconnecting the first electrodes to the second electrodes by interconnects penetrating the holes; and
testing the semiconductor assembly by applying a test voltage to a test electrode of the semiconductor assembly, wherein the test electrode is electrically connected with the electrically conducting layer.

19. The method of claim 18, wherein the test voltage is applied between a power supply electrode of the first semiconductor substrate or a power supply electrode of the second semiconductor substrate and the test electrode.

20. The method of claim 18, wherein electrically interconnecting the first electrodes to the second electrodes comprises one or more of soldering, sintering or gluing using a conducting adhesive.

21. The method of claim 18, wherein the test voltage is equal to or greater than 5, 7 or 10 times the operational voltage of the first semiconductor substrate or the second semiconductor substrate.

22. The method of claim 18, wherein during normal operation of the semiconductor assembly, the test electrode is configured to be left floating.

* * * * *